(12) United States Patent
Li et al.

(10) Patent No.: US 11,258,021 B2
(45) Date of Patent: Feb. 22, 2022

(54) DISPLAY PANEL AND DISPLAY DEVICE HAVING A STEP PORTION

(71) Applicant: EverDisplay Optronics (Shanghai) Co., Ltd., Shanghai (CN)

(72) Inventors: Jiajia Li, Shanghai (CN); Run Lin, Shanghai (CN); Xinyuan Wei, Shanghai (CN); Xun Lao, Shanghai (CN); Zhongchun Wang, Shanghai (CN)

(73) Assignee: Everdisplay Optronics (Shanghai) Co., Ltd, Shanghai (CN)

( * ) Notice: Subject to any disclaimer, the term of this patent is extended or adjusted under 35 U.S.C. 154(b) by 0 days.

(21) Appl. No.: 16/597,919

(22) Filed: Oct. 10, 2019

(65) Prior Publication Data

US 2020/0119292 A1    Apr. 16, 2020

(30) Foreign Application Priority Data

Oct. 11, 2018    (CN) .......................... 201811184371.4

(51) Int. Cl.
*H01L 51/00* (2006.01)
*H01L 51/52* (2006.01)
(Continued)

(52) U.S. Cl.
CPC ...... *H01L 51/0097* (2013.01); *H01L 51/5253* (2013.01); *H01L 51/56* (2013.01); *G02F 1/133528* (2013.01); *H01L 27/14678* (2013.01); *H01L 27/3244* (2013.01); *H01L 27/3262* (2013.01); *H01L 27/3274* (2013.01);
(Continued)

(58) Field of Classification Search
CPC ............. H01L 51/0097; H01L 51/5253; H01L 51/5246; H01L 2251/5338; H01L 27/14678; H01L 27/3244; H01L 27/3274; H01L 27/3262; H01L 33/20; H01L 51/5293; H01L 27/323; G02F 2001/133357
See application file for complete search history.

(56) References Cited

U.S. PATENT DOCUMENTS 9,001,280 B2 * 4/2015 Xu .......................... G06F 1/1601
                                                          349/12
9,614,168 B2 * 4/2017 Zhang ................... H01L 51/004
(Continued)

FOREIGN PATENT DOCUMENTS

CN    203706166 U  *  7/2014
CN    205609529 U  *  9/2016

*Primary Examiner* — Ida M Soward
(74) *Attorney, Agent, or Firm* — Qinghong Xu

(57) ABSTRACT

A display panel being bendable around a bending axis to form a bendable portion, includes a support film, a display module disposed on a side of the support film. An outer edge of the display module is distant from an outer edge along the first direction of the support film, to form a step portion between the outer edge of the display module and the outer edge of the support film. A polarizing layer and a touch layer are disposed on the other side, facing away the support film, of the display module. An outer edge of the polarizing layer and an outer edge of the touch layer are distant from the outer edge of the display module to form a step portion between the outer edge of the polarizing layer, the outer edge of the touch layer and the outer edge of the display module.

15 Claims, 14 Drawing Sheets

(51) Int. Cl.
*H01L 27/14* (2006.01)
*H01L 27/32* (2006.01)
*H01L 33/20* (2010.01)
*G02F 1/133* (2006.01)
*H01L 51/56* (2006.01)
*H01L 27/146* (2006.01)
*G02F 1/1335* (2006.01)

(52) U.S. Cl.
CPC .......... *H01L 33/20* (2013.01); *H01L 51/5246* (2013.01); *H01L 51/5293* (2013.01); *H01L 2251/5338* (2013.01)

(56) References Cited

U.S. PATENT DOCUMENTS

| | | | | |
|---|---|---|---|---|
| 9,812,514 | B2* | 11/2017 | Liu | H01L 51/5246 |
| 9,941,337 | B2* | 4/2018 | Kwon | H01L 27/3248 |
| 10,168,814 | B2* | 1/2019 | Hotelling | G06F 3/0443 |
| 10,192,939 | B2* | 1/2019 | Wang | H01L 51/0097 |
| 10,198,123 | B2* | 2/2019 | Chen | G06F 3/044 |
| 10,331,254 | B2* | 6/2019 | Wang | G06F 3/0412 |
| 10,614,283 | B2* | 4/2020 | He | G06F 3/0412 |
| 10,649,264 | B2* | 5/2020 | Xue | G02F 1/13318 |
| 10,824,840 | B2* | 11/2020 | Song | G06K 9/00033 |
| 2011/0227835 | A1* | 9/2011 | Lin | G02F 1/13363 345/173 |
| 2013/0011969 | A1* | 1/2013 | Chen | H01L 51/003 438/111 |
| 2013/0258213 | A1* | 10/2013 | Ek | G02F 1/133504 349/5 |
| 2015/0363029 | A1* | 12/2015 | Hsieh | G06F 1/1637 349/12 |
| 2015/0380675 | A1* | 12/2015 | Kim | H01L 51/5293 438/26 |
| 2016/0041679 | A1* | 2/2016 | Ahn | H01L 51/0097 345/173 |
| 2016/0147353 | A1* | 5/2016 | Filiz | G01L 1/16 345/174 |
| 2016/0170443 | A1* | 6/2016 | Namkung | G02F 1/133351 359/483.01 |
| 2016/0276589 | A1* | 9/2016 | Lee | H01L 51/0097 |
| 2017/0153371 | A1* | 6/2017 | Lim | H01L 51/5237 |
| 2018/0034130 | A1* | 2/2018 | Jang | H01Q 1/2266 |
| 2018/0088712 | A1* | 3/2018 | Kim | G02F 1/13338 |
| 2018/0138261 | A1* | 5/2018 | Lee | G06F 3/0446 |
| 2018/0159087 | A1* | 6/2018 | Yug | H01L 27/323 |
| 2018/0203532 | A1* | 7/2018 | Chang | G06F 3/0445 |
| 2018/0321764 | A1* | 11/2018 | Oh | H01L 51/5253 |
| 2018/0342699 | A1* | 11/2018 | Son | H01L 51/5281 |
| 2019/0034020 | A1* | 1/2019 | He | G06K 9/00033 |
| 2019/0080140 | A1* | 3/2019 | Lee | H05K 1/189 |
| 2019/0131374 | A1* | 5/2019 | Kishimoto | H01L 27/3272 |
| 2019/0197281 | A1* | 6/2019 | Choi | G06K 9/209 |
| 2021/0064174 | A1* | 3/2021 | Kim | G02F 1/13338 |

* cited by examiner

DISPLAY PANEL AND DISPLAY DEVICE HAVING A STEP PORTION

CROSS REFERENCE

This application is based upon and claims the benefit of priority of Chinese Patent Application No. 201811184371.4, filed on Oct. 11, 2018, the entire contents thereof are incorporated herein by reference.

TECHNICAL FIELD

The present disclosure relates to the field of display technologies, specifically to a display panel, a display device and a manufacturing method thereof.

BACKGROUND

The bendable display panel is an unstopped trend in the development of display technology and has bright market future. The flexible active-matrix organic light-emitting diode (AMOLED) display is the key technology to achieve a bendable display panel. However, in the current flexible display panel, a large shear force of film is often caused in the bending process such that the inorganic film layer on the edges of the display panel are then cracked. Therefore, the product yield of display panel is reduced.

SUMMARY

In view of the defects of the prior art, the present disclosure provides a display panel, a display device and a method of manufacturing the display panel. By optimizing the edges of the display panel, the shear forces between the various layers of the display panel are reduced, and the bending reliability of the flexible panel is improved.

In one embodiment of the present disclosure, a display panel being bendable around a bending axis, extending along a first direction, to form a bendable portion, includes a support film, a display module disposed on a side of the support film, wherein the display module is disposed on an inner side of the bendable portion. An outer edge of the display module is distant from an outer edge of the support film along the first direction to form a step portion between the outer edge of the display module and the outer edge of the support film.

A polarizing layer and a touch layer are disposed on the other side, facing away the support film, of the display module. An outer edge of the polarizing layer and an outer edge of the touch layer are distant from the outer edge of the display module along the first direction to form a step portion between the outer edge of the polarizing layer, the outer edge of the touch layer and the outer edge of the display module.

In one embodiment of the present disclosure, a display device having a display panel being bendable around a bending axis, extending along a first direction, to form a bendable portion further includes a support film and a display module disposed on a side of the support film, wherein the display module is disposed on an inner side of the bendable portion. An outer edge of the display module is distant from an outer edge of the support film along the first direction to form a step portion between the outer edge of the display module and the outer edge of the support film.

A polarizing layer and a touch layer are disposed on the other side, facing away the support film, of the display module. An outer edge of the polarizing layer and an outer edge of the touch layer are distant from the outer edge of the display module along the first direction to form a step portion between the outer edge of the polarizing layer, the outer edge of the touch layer and the outer edge of the display module.

In one embodiment of the present disclosure, a method for manufacturing a display panel, includes steps of providing a support film; attaching a display module to a side of the support film, wherein an outer edge of the display module is distant from the outer edge of the support film to form a step portion between an outer edge of the display module and an outer edge of the support film; and attaching a polarizing layer and a touch layer to a side, away from the support film, of the display module, wherein an outer edge of the polarizing layer and an outer edge of the touch layer are distant from the outer edge of the display module along the first direction to form a step portion between the outer edge of the polarizing layer, the outer edge of the touch layer and the outer edge of the display module.

Compared with the prior art, when the display panel provided in the present disclosure is bent inward, its display surface faces inward, and the outer edge of the display module is inwardly retracted from the outer edge of the support film, so as the polarizing layer and the touch layer; When the display panel is bent outward, its display surface faces outward, and the outer edge of the display module extends outwardly from to the outer edge of the support film, so as the polarizing layer and the touch layer; the display panel provided in the present disclosure is optimized at its edges of the panel module, therefore, the shear forces between the various layers of the display panel are reduced and the bending reliability of the flexible panel is improved.

BRIEF DESCRIPTION OF THE DRAWINGS

Embodiments of the present disclosure will now be described, by way of example only, with reference to the accompanying schematic drawings in which corresponding reference symbols indicate corresponding parts, and in which.

DETAILED DESCRIPTION

In the following, embodiments of the present disclosure will be described in detail referring to figures. The concept and its realizations of the present disclosure can be implemented in a plurality of forms, and should not be understood to be limited to the embodiments described hereafter. In contrary, these embodiments are provided to make the present disclosure more comprehensive and understandable, and so the conception of the embodiments can be conveyed to the technicians in the art fully. Same reference signs in the figures refer to same or similar structures, so repeated description of them will be omitted.

The features, structures or characteristics described can be combined in any appropriate way in one or more embodiments. In the description below, many specific details are provided to explain the embodiments of the present disclosure fully. However, the technicians in the art should realize that, without one or more of the specific details, or adopting other methods, components, materials etc., the technical proposal of the present disclosure can still be realized. In certain conditions, structures, materials or operations well known are not shown or described in detail so as not to obfuscate the present disclosure. The technical contents of the present disclosure will be further described below with reference to the figures and embodiments. It should be stated that a plurality of embodiments described below along with their combinations and varieties, beyond doubt are within the scope of the present disclosure.

In some embodiments of the present disclosure, a display panel being bendable around a bending axis, extending along a first direction, to form a bendable portion, includes a support film, a display module disposed on a side of the support film, wherein the display module is disposed on an inner side of the bendable portion. An outer edge of the display module is distant from an outer edge of the support film along the first direction to form a step portion between the outer edge of the display module and the outer edge of the support film.

A polarizing layer and a touch layer are disposed on the other side, facing away the support film, of the display module. An outer edge of the polarizing layer and an outer edge of the touch layer are distant from the outer edge of the display module along the first direction to form a step portion between the outer edge of the polarizing layer, the outer edge of the touch layer and the outer edge of the display module.

Figure 1:
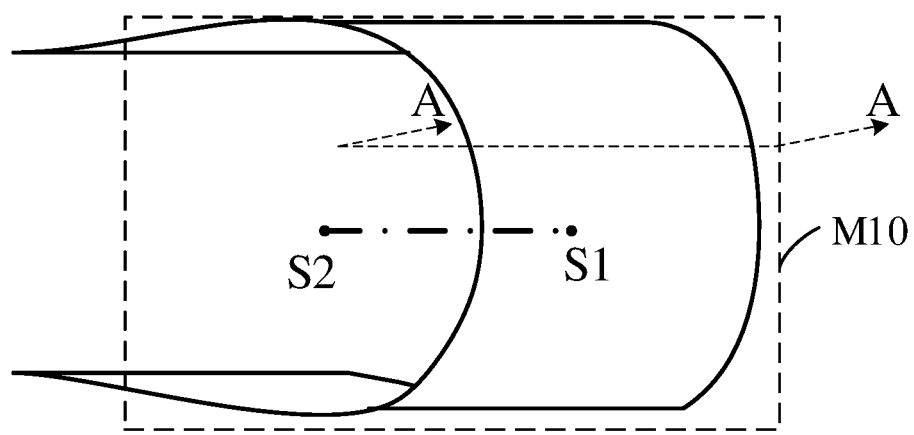
FIG. 1 is a schematic view of a bending diagram of a display panel of one embodiment of the present disclosure.
Figure 2:
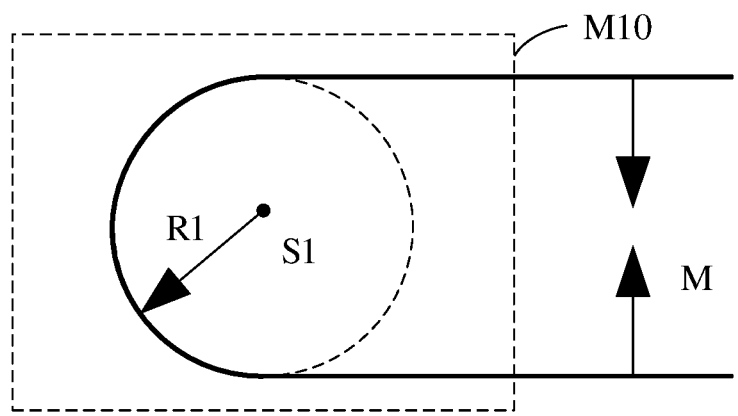
FIG. 2 is a schematic view of a bending diagram of a display panel of one embodiment of the present disclosure.

As shown in FIG. 1 to FIG. 6, in one embodiment of the present disclosure, a display panel that is bent around a bending axis (S1-S2), extending in a first direction, to form a bendable portion M10. In this embodiment, the display panel is bent inwardly, and display surface of the display panel faces inwardly. As shown in FIG. 2, the display direction of the display surface is M, and the radius of the bendable portion M10 of the display panel is R1.

Figure 3:
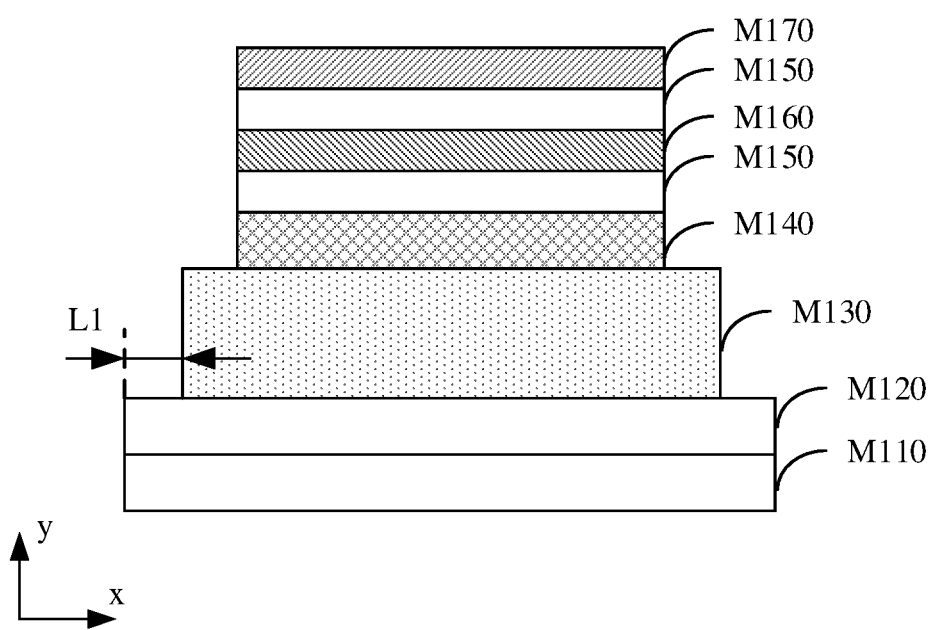
FIG. 3 is a cross-sectional view, along a A-A direction, of the display panel of FIG. 1.

As shown in FIG. 3, a cross-sectional view, along an A-A direction, of the display panel of FIG. 1, the edges of the layers of the display panel are not aligned each other to form a step edge. The x direction is the extending direction of the bending axis (S1-S2). In this embodiment, the x direction is a first direction and the y direction is a direction perpendicular to the bending axis (S1-S2). Moreover, the y direction is also the direction for cutting the display panel.

In this embodiment, the display panel includes a support film M120, located outside of the bendable portion of the display panel. A display module M130 is disposed on a side of the support film M120 and the display module M130 is disposed on an inner side of the bendable portion. An outer edge of the display module M130, in this embodiment, is inwardly retracted along the first direction, from the outer edge of the support film M120, to form a step portion between the outer edge of the display module M130 and the outer edge of the support film M120.

A polarizing layer M140 and a touch layer M160 are disposed on the other side, being away the support film M120, of the display module. An outer edge of the polarizing layer M140 and an outer edge of the touch layer M160 are inwardly retracted, along the first direction, from the outer edge of the display module M130 to form a step portion between the outer edge of the polarizing layer M140, the outer edge of the touch layer 160 and the outer edge of the display module M130.

In this embodiment, the outer edge of the display module M130 is inwardly retracted a distance L1, 0.05 mm to 1.00 mm, from the outer edge of the support film M120 along the first direction. The outer edge of the polarizing layer M140 and the outer edge of the touch layer M160 are inwardly retracted 0.05 mm to 1.00 mm from the outer edge of the display module M130 along the first direction.

In this embodiment, in order to prevent the damage caused by the outside forces, the outer edge of the display panel and the step portion are both coated with a layer of protective glue, and the protective glue includes a UV glue (photosensitive glue) or a Tuffy glue.

Furthermore, in this embodiment, steps also can be formed between layers of the display panel. The outer edge of the touch layer M160 is inwardly retracted from the outer edge of the polarizing layer 140 in the first direction. An optically clear adhesive (OCA) M150 is applied between the touch layer M160 and the polarizing layer M140. Moreover, the OCA is applied between the polarizing layer M140 and the hard coating layer M170. A step structure is sequentially formed by at least two layers located between the polarizing layer M140 and hard coating layer M170. A foam layer M110 is disposed under the support film M120, and the edge of the foam layer M110 and the edge of the support film M120 is aligned, or be a step structure.

Figure 4:
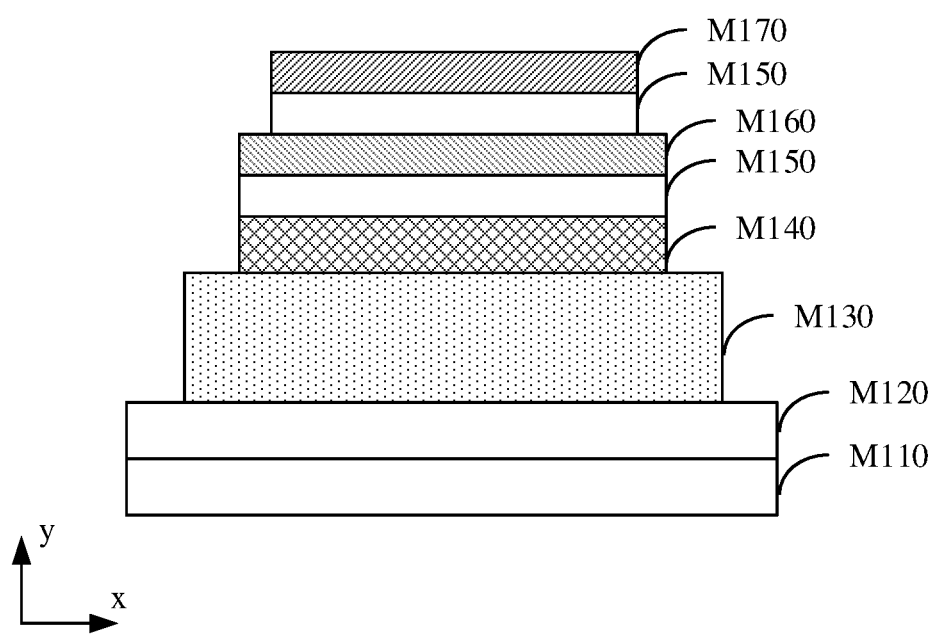
FIGS. 4 to 6 are cross-sectional views of a display panel of embodiments of the present disclosure.
Figure 5:
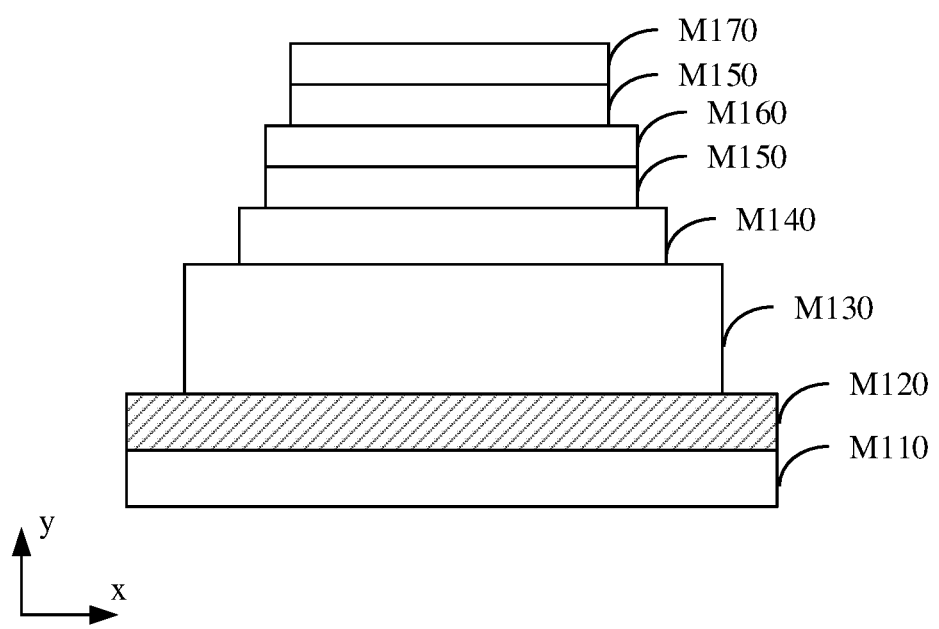
Figure 6:
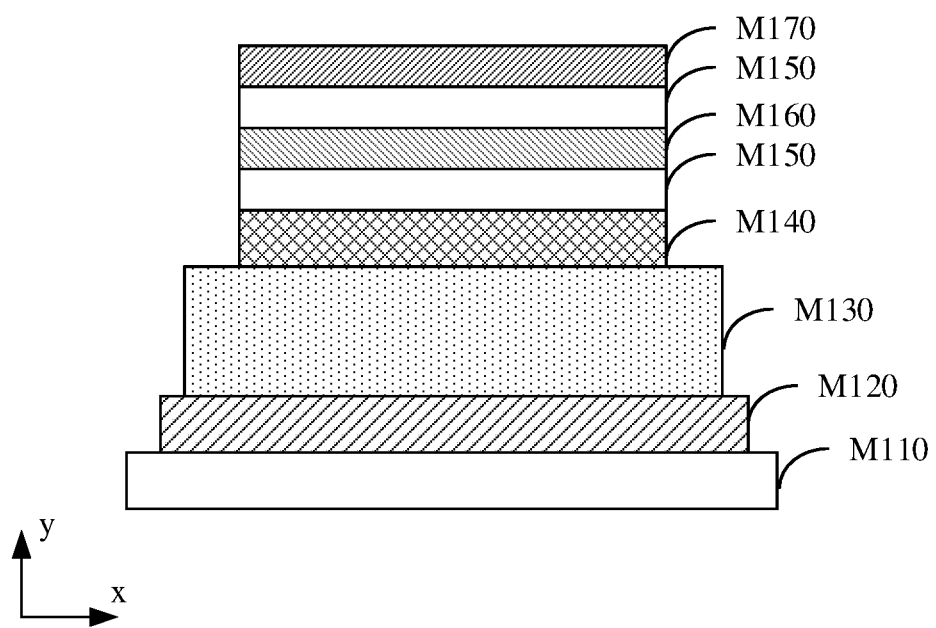

FIGS. 4 to 6 are cross-sectional views of a display panel of embodiments of the present disclosure. A step portion, in this embodiment, is formed between the hard coating layer M170 and the touch layer M160 (as shown in FIG. 4). In some embodiments, a step portion is formed between the touch layer M160 and the polarizing layer M140 (as shown in FIG. 5). In some other embodiments, a step portion is formed is formed between the foam layer M110 and the support films M120 (as shown in FIG. 6). The present disclosure is not limited to the embodiments shown in FIGS. 3 to 6, and the number and position of the step portions are selectable as needed, which are within the scope of the present disclosure.

In some embodiments, the display module including an OLED display module, includes a flexible substrate disposed on one side of the support film.

A driver array layer disposed on a side, away from the support film, of the flexible substrate, e.g. a thin film transistor (TFT) array etc.

A light-emitting layer disposed on a side, away from the flexible substrate, of the driver array layer and the light-emitting layer includes a cathode, an anode and a light-emitting layer, etc. a plurality of light-emitting diodes, disposed in the light-emitting layer, are driven by the driver layer to emit light.

A thin-film encapsulation layer disposed on a side, away from the driver array layer, of the light-emitting layer.

In this embodiment, by adopting the edge structure of the display panel, the shear forces between the adjacent film layers in the display panel is then reduced. Therefore, the risk of film breakage, during the bending process, is then reduced and the bending flexibility of the flexible display panel is then improved. In the meantime, the target of a smaller bending radius R1 in the flexible display panel is then achieved.

Figure 7:
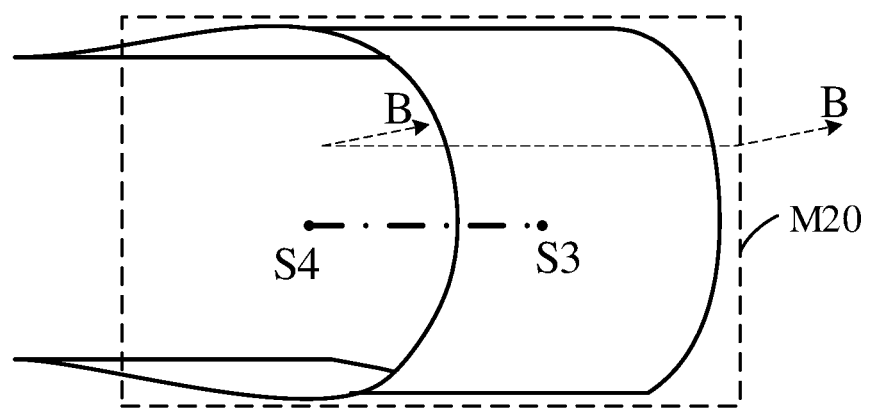
FIG. 7 is a schematic view of a bending diagram of a display panel in one embodiment of the present disclosure.
Figure 8:
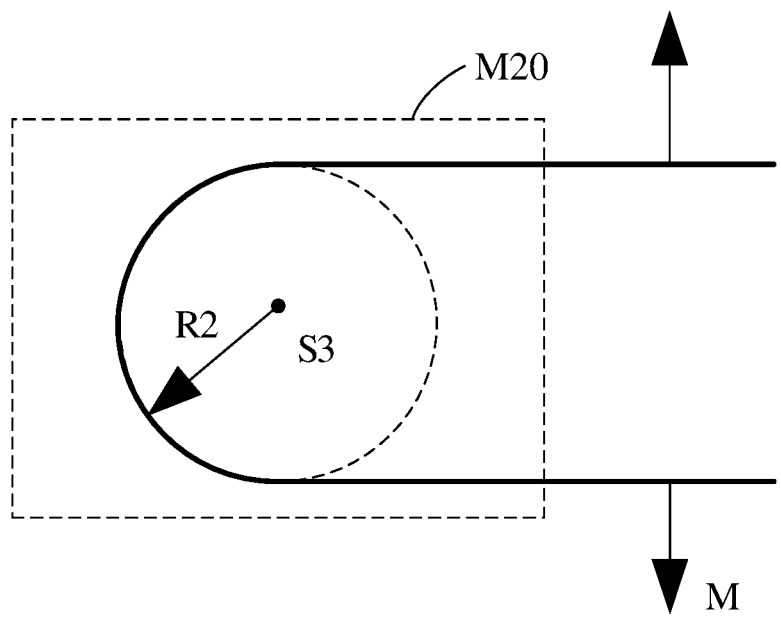
FIG. 8 is a schematic view of a outward bending diagram of a display panel in one embodiment of the present disclosure.

As shown in FIGS. 7 to 12, another embodiment of the present disclosure provides a structure of a display panel. As shown in FIG. 7, in this embodiment, the display panel is bent outwardly around the bending axis (S3-S4) to form a bendable portion M20, and the display surface of the display panel faces outward. AS shown in FIG. 8, the display direction M faces outwardly, and the radius of the bendable portion M20 of the display panel is R2. The direction in which the bending axis (S3-S4) extends is the x-axis direction, the first direction, shown in FIG. 8. The y-axis direction is a direction perpendicular to the x-axis direction and is also the direction in cutting the display panel.

Figure 9:
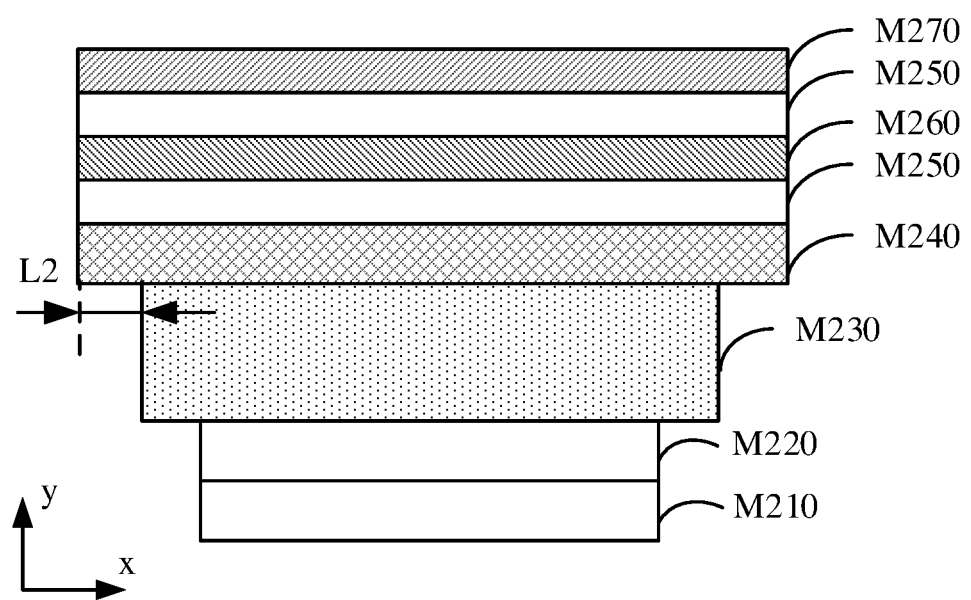
FIG. 9 is a cross-sectional view, along a B-B direction, of the display panel of FIG. 7.

As shown in FIG. 9, in this embodiment, the display panel includes a support film M220, located on an inner side of the display panel. A display module M230 is disposed on a side of the support film M220 and the display module M230 is disposed on an outer side of the bendable portion. An outer edge of the display module M230 outwardly extends, from the outer edge of the support film M220, along the first direction to form a step portion between the outer edge of the display module M230 and the outer edge of the support film M220. A polarizing layer M240 and a touch layer M260 are disposed on the other side, away from the support film M220, of the display module, and an outer edge of the polarizing layer M240 and an outer edge of the touch layer M260 outwardly extend, from the outer edge of the display module M230, along the first direction to form a step portion between the outer edge of the polarizing layer M240, the outer edge of the touch layer M260 and the outer edge of the display module M230.

In this embodiment, the outer edge of the display module M230 outwardly extends, from the outer edge of the support film M220 and along the first direction, 0.05 mm to 1.00 mm. The outer edge of the polarizing layer M240 and the outer edge of the touch layer M260 outwardly extend, from the outer edge of the display module M230, a distance L2, wherein a distance range of the distance L2 is about 0.05 mm to 1.00 mm.

In this embodiment, in order to protect the edges from damages made by external forces, the outer edge of the display panel and the step portion are both coated with protective glue, and the protective glue includes UV glue (photosensitive glue) or Tuffy glue.

Furthermore, in this embodiment, steps also can be formed between any layers of the display panel. The outer edge of the touch layer M260 outwardly extends from the outer edge of the polarizing layer 240 along the first direction. An optically clear adhesive M250 is applied between the touch layer M260 and the polarizing layer M240. In this embodiment, the optically clear adhesive M250 is also applied between the polarizing layer M240 and the hard coating layer M270. The step structure is respectively formed between any two layers that are located between the polarizing layer M240 and hard coating layer M270. Also, a foam layer M210 is disposed under the support film M220. The edge of the foam layer M210 and the edge of the support film M220 are aligned. In some embodiments, a step structure is formed between the edge of the foam layer M210 and the edge of the support film M220.

Figure 10:
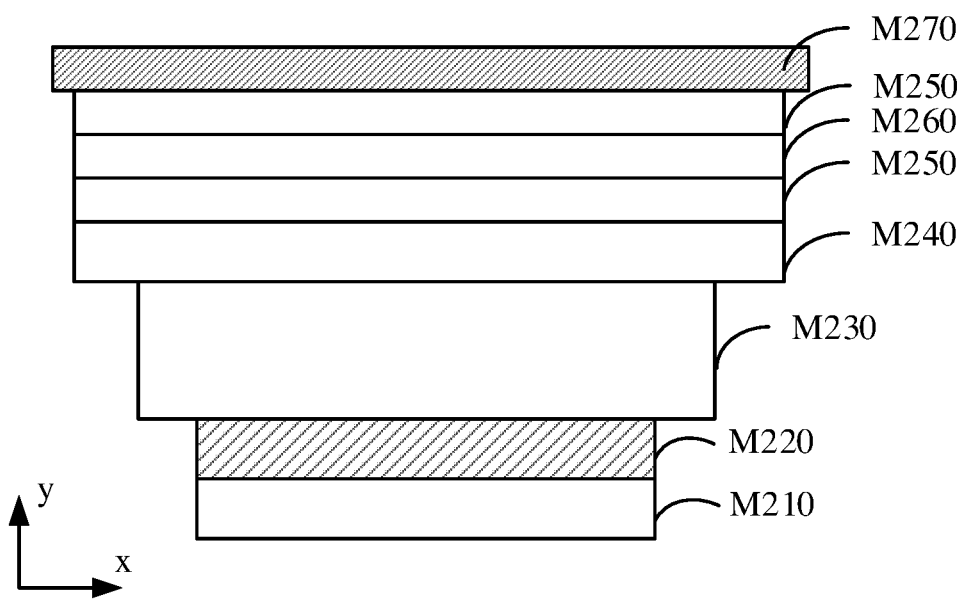
FIGS. 10 to 12 are cross-sectional views of a display panel of embodiments of the present disclosure.
Figure 11:
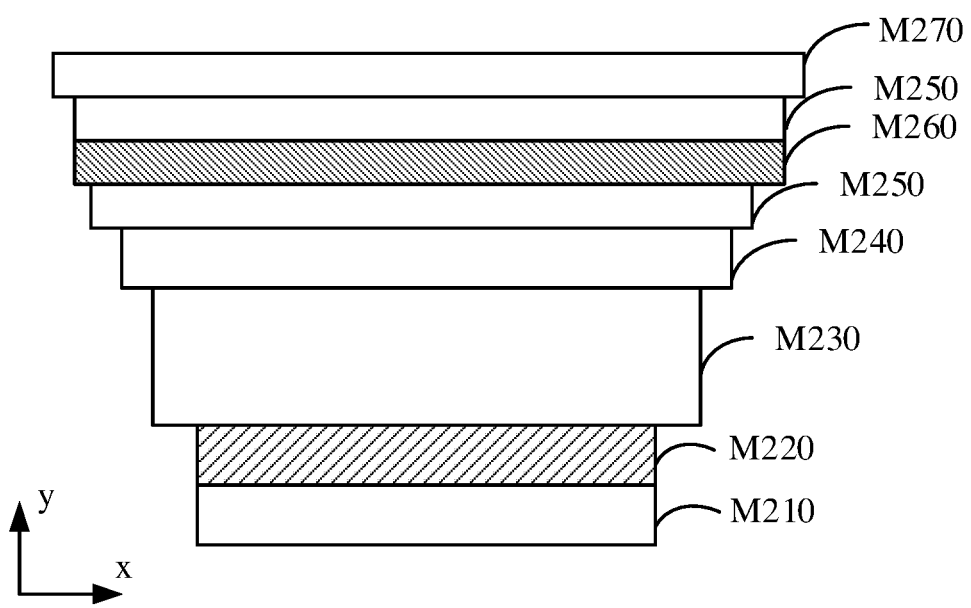
Figure 12:
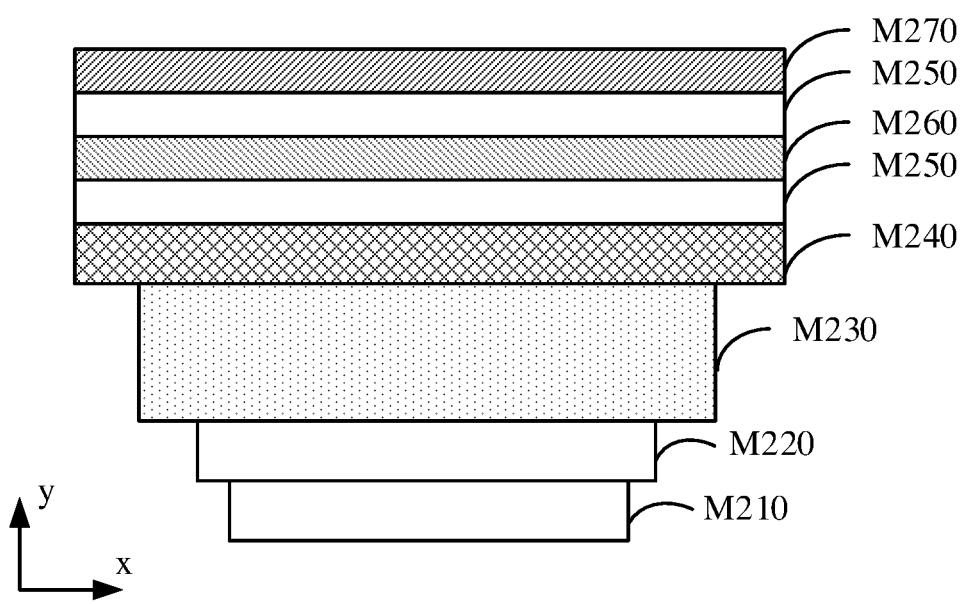

FIGS. 10, 11 and 12 are cross-sectional views of display panels of other different embodiments of the present disclosure. As shown in FIG. 10, a step is formed between the touch layer M260 and the hard coating layer M270. As shown in FIG. 11, a step is formed between the touch layer M260 and the polarizing layer M240. As shown in FIG. 12, a step is formed between the foam layer M210 and the support films M220. The present disclosure is not limited to the embodiments shown in FIGS. 10, 11 and 12, and the number and position of the step structures can be designed as needed, which are all within the scope of the present disclosure.

In this embodiment, the display module includes an OLED display module which includes a flexible substrate located on a side of the support film, a driver array layer disposed on a side, away from the support film, of the flexible substructure. In this embodiment, the driver array layer includes a thin film transistor (TFT) array.

Moreover, the OLED display module further includes a light-emitting layer disposed on a side, away from the flexible substrate, of the driver array layer and the light-emitting layer includes a cathode, an anode and a light-emitting layer and a plurality of light-emitting diodes, disposed in the light-emitting layer, are driven, by the driver array layer, to emit light. An encapsulation layer deposited on a side, away from the driver array layer, of the light-emitting layer.

In this embodiment, by adopting the edge structure of the display panel, the shear forces between two adjacent film layers in the display panel is then reduced. Therefore, the risk of film breakage, during the bending process, is then reduced and the bending flexibility of the flexible display panel is then improved. In the meantime, the target of a smaller bending radius R2 in the flexible display panel is then achieved.

In some embodiments of the present disclosure, a display device including the mentioned display panel is provided. The display device having a display panel being bendable around a bending axis, extending along a first direction, to form a bendable portion further includes a support film and a display module disposed on a side of the support film, wherein the display module is disposed on an inner side of the bendable portion. An outer edge of the display module is distant from an outer edge of the support film along the first direction to form a step portion between the outer edge of the display module and the outer edge of the support film.

A polarizing layer and a touch layer are disposed on the other side, facing away the support film, of the display module. An outer edge of the polarizing layer and an outer edge of the touch layer are distant from the outer edge of the display module along the first direction to form a step portion between the outer edge of the polarizing layer, the outer edge of the touch layer and the outer edge of the display module.

Therefore, the display device, in some embodiments, includes a display panel which is outwardly bended. In some embodiments, the display panel includes a display panel which is inwardly bended.

Moreover, the display device includes a mobile phone, a tablet computer, a computer display screen, a battery screen, etc., but is not limited thereto.

By adopting the edge design of the display panel of the present disclosure, the edge of the display panel module is optimized to reduce the shear forces between the various layers, thereby the bending flexibility of the flexible display panel is then improved, and the life of the display device is extended.

In some embodiments of the present disclosure, a method for manufacturing a display panel, includes steps of providing a support film; attaching a display module to a side of the support film, wherein an outer edge of the display module is distant from the outer edge of the support film to form a step portion between an outer edge of the display module and an outer edge of the support film; and attaching a polarizing layer and a touch layer to a side, away from the support film of the display module, wherein an outer edge of the polarizing layer and an outer edge of the touch layer are distant from the outer edge of the display module along the first direction to form a step portion between the outer edge of the polarizing layer, the outer edge of the touch layer and the outer edge of the display module.

Figure 13:
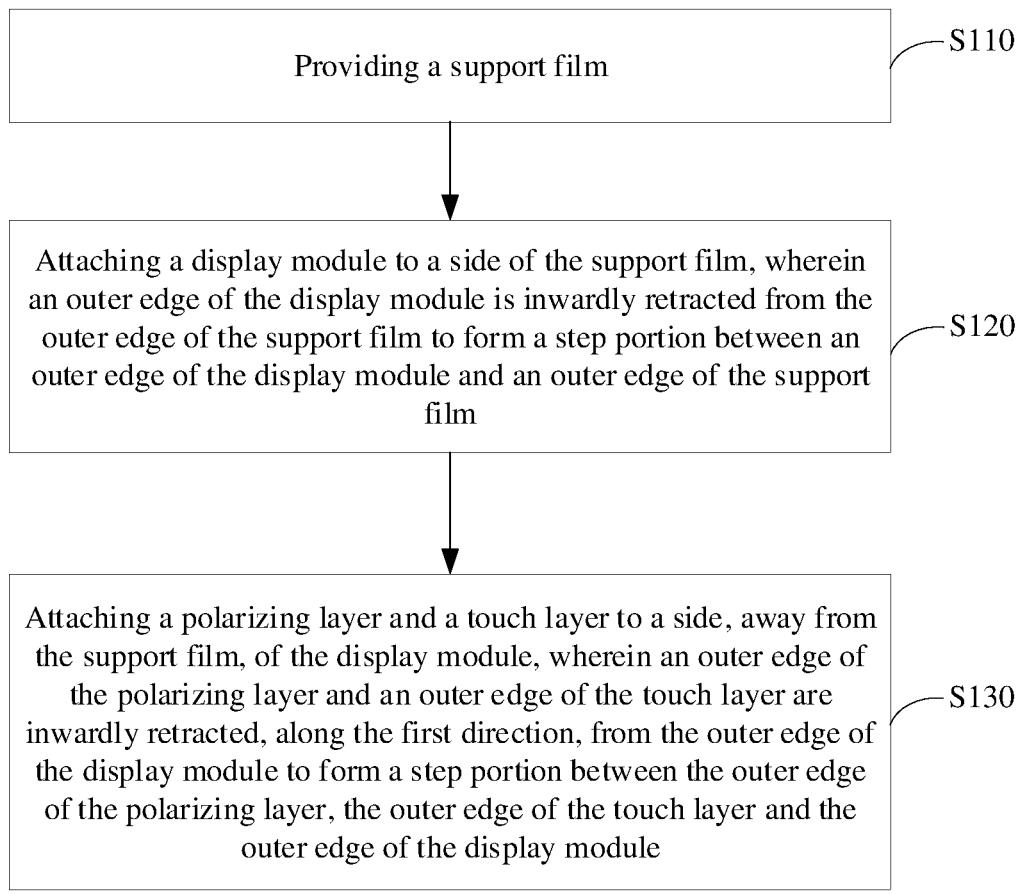
FIG. 13 is a flowchart of a method of manufacturing a display panel in one embodiment of the present disclosure.

As shown in FIG. 13, in one embodiment of the present disclosure, also provide a method for manufacturing a display panel is provided.

In step S110: a support film is provided

In step S120: a display module is attached to a side of the support film, wherein an outer edge of the display module is inwardly retracted from the outer edge of the support film to form a step portion between an outer edge of the display module and an outer edge of the support film.

In step S130: a polarizing layer and a touch layer are attached to a side, away from the support film, of the display module, wherein an outer edge of the polarizing layer and an outer edge of the touch layer are inwardly retracted, along the first direction, from the outer edge of the display module to form a step portion between the outer edge of the polarizing layer, the outer edge of the touch layer and the outer edge of the display module.

The structure of the display panel formed by the method shown in FIG. 13 can be referred to FIG. 1 to FIG. 6. The display panel is bent inwardly and the display direction M of the display panel faces inwardly. The mentioned layers of the display module M130 is retracted, and the layers below the display module M130 is extended outwardly.

In this embodiment, the outer edge of the display module M130 is inwardly retracted, from the outer edge of the support film M120, a distance of L1 along the first direction and the range of the distance L1 is 0.05 mm to 1.00 mm. In addition, the outer edge of the polarizing layer M140 and the outer edge of the touch layer M160 are inwardly retracted a distance in a range of 0.05 mm to 1.00 mm from the outer edge of the display module M130 along the first direction.

Similarly, in order to protect the edges from damages made by external forces, the outer edge of the display panel and the step portion are both coated with protective glue, and the protective glue includes UV glue (photosensitive glue) or Tuffy glue.

Furthermore, in this embodiment, steps also are also formed between any layers of the display panel. The outer edge of the touch layer M160 is inwardly retracted from the outer edge of the polarizing layer 140 along the first direction. An optically clear adhesive (OCA) M150 is applied between the touch layer M160 and the polarizing layer M140. Moreover, the OCA is applied between the polarizing layer M140 and the hard coating layer M170. A step structure is sequentially formed by at least two layers located between the polarizing layer M140 and hard coating layer M170. A foam layer M110 is disposed under the support film M120. The edge of the foam layer M110 and the edge of the support film M120 is aligned, or the edge of the foam layer M110 and the edge of the support film M120 is formed a step structure.

In this embodiment, the display module includes an OLED display module which includes a flexible substrate disposed on a side of the support film and a driver array layer disposed on one side of the flexible substrate, away from the support film, e.g. a thin film transistor (TFT) array.

A light-emitting layer is disposed on a side, away from the flexible substrate, of the driver array layer, and the light-emitting layer comprises a cathode, an anode and a light-emitting layer. A plurality of light-emitting diodes are disposed in the light-emitting layer, which are driven, by the driver array layer, to emit light.

A thin-film encapsulation layer disposed on a side, away from the driver array layer, of the light-emitting layer.

In this embodiment, by adopting the method for manufacturing a display panel, a display panel includes a step edge which will reduce the shear forces between the adjacent film layers. Therefore, the risk of film breakage, during the bending process, is then reduced and the bending flexibility of the flexible display panel is then improved. In the meantime, the target of a smaller bending radius R1 in the flexible display panel is then achieved.

Figure 14:
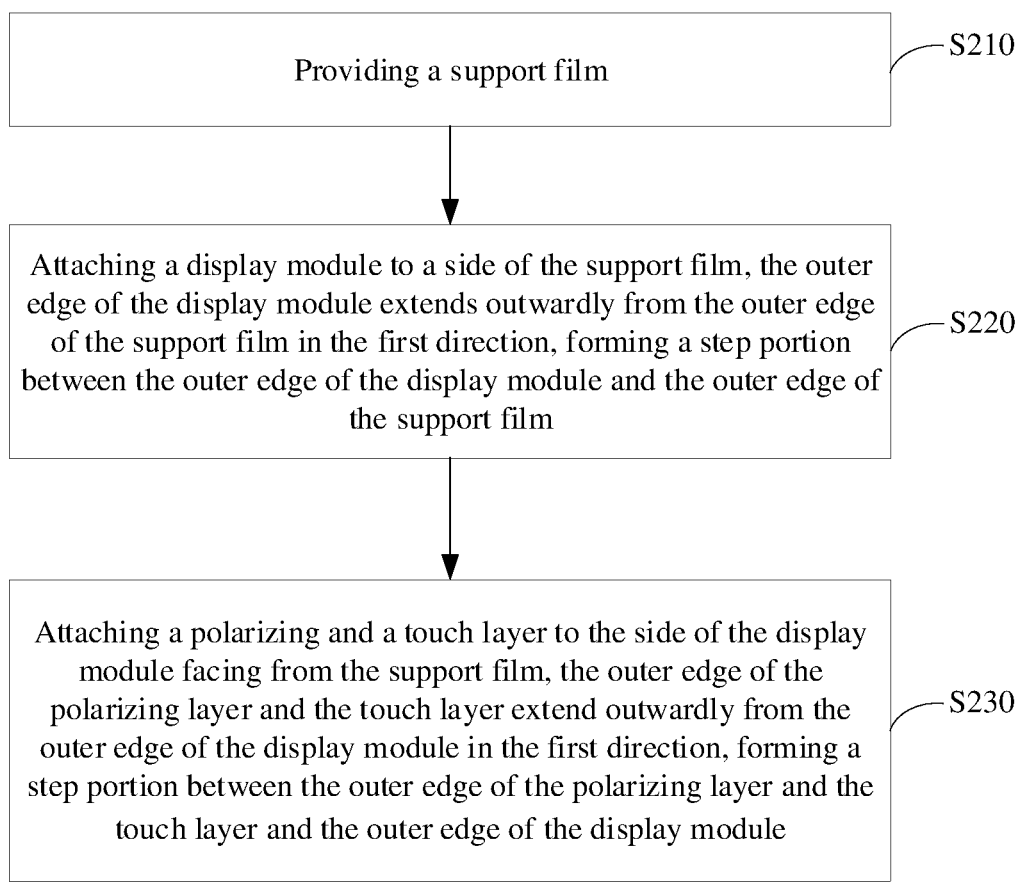
FIG. 14 is a flowchart of a method of manufacturing a display panel in another embodiment of the present disclosure.

As shown in FIG. 14, one embodiment of the present disclosure also provides a method for manufacturing a display panel.

In step S210: a support film is provided.

In step S220: a display module is attached to a side of the support film, the outer edge of the display module extends outwardly from the outer edge of the support film in the first direction, forming a step portion between the outer edge of the display module and the outer edge of the support film.

In step S230: a polarizing and a touch layer are attached to the side of the display module facing from the support film, the outer edge of the polarizing layer and the touch layer extend outwardly from the outer edge of the display module in the first direction, forming a step portion between the outer edge of the polarizing layer and the touch layer and the outer edge of the display module.

The structure of the display panel formed by the method shown in FIG. 14 can be referred to FIG. 7 to FIG. 12. The display panel is bent outwardly and the display direction M of the display panel faces outwardly. The mentioned layers of the display module M230 is extended outward, and the layers below the display module M230 is retracted.

In this embodiment, the outer edge of the display module M230 outwardly extends, from the outer edge of the support film M220 and along the first direction, a distance in a range of 0.05 mm to 1.00 mm. The outer edge of the polarizing layer M240 and the outer edge of the touch layer M260 are outwardly extended, from the outer edge of the display module M230, a distance L2 and the distance L2 is in a range of 0.05 mm to 1.00 mm.

Also, in this embodiment, in order to protect the edges from damages made by external forces, the outer edge of the display panel and the step portion are both coated with protective glue, and the protective glue includes UV glue (photosensitive glue) or Tuffy glue.

In addition, in this embodiment, steps are also formed between any layers of the display panel. The outer edge of the touch layer M260 outwardly extends from the outer edge of the polarizing layer 240 along the first direction. An optically clear adhesive M250 is applied between the touch layer M260 and the polarizing layer M240. Moreover. The OCA is applied between the polarizing layer M240 and the hard coating layer M270. A step structure is sequentially formed by at least two layers located between the polarizing layer M240 and hard coating layer M270. A foam layer M210 is disposed under the support film M220, and the edge of the foam layer M210 and the edge of the support film M220 is aligned, or the edge of the foam layer M210 and the edge of the support film M220 is formed a step structure.

In this embodiment, the display module is an OLED display module which includes a flexible substrate disposed on a side of the support film and a driver array layer disposed on one side of the flexible substrate, away from the support film. e.g. a thin film transistor (TFT) array.

A light-emitting layer is disposed on a side, away from the flexible substrate, of the driver array layer, and the light-emitting layer comprises a cathode, an anode and a light-emitting layer. A plurality of light-emitting diodes are disposed in the light-emitting layer, which are driven, by the driver array layer, to emit light.

A thin-film encapsulation layer disposed on a side, away from the driver array layer, of the light-emitting layer.

In this embodiment, by adopting the method for manufacturing a display panel, a display panel includes a step edge which will reduce the shear force between the adjacent film layers. Therefore, the risk of film breakage during the bending process, is then reduced and the bending flexibility of the flexible display panel is then improved. In the meantime, the target of a smaller bending radius R2 in the flexible display panel is then achieved.

What is claimed is:

1. A display panel being bendable around a bending axis, extending along a first direction, to form a bendable portion, comprising:
    a support film;
    a display module disposed on a side of the support film, wherein the display module is disposed on an inner side of the bendable portion, wherein an outer edge of the display module is distant from an outer edge of the support film along the first direction to form a step portion between the outer edge of the display module and the outer edge of the support film; and
    a polarizing layer and a touch layer disposed on a side facing away from the support film of the display module, wherein an outer edge of the polarizing layer and an outer edge of the touch layer are distant from the outer edge of the display module along the first direction to form a step portion between the outer edge of the polarizing layer, the outer edge of the touch layer and the outer edge of the display module.

2. The display panel of claim 1, wherein the outer edge of the display module is inwardly retracted a distance from the outer edge of the support film along the first direction, and the outer edge of the polarizing layer and the outer edge of the touch layer are inwardly retracted a distance from the outer edge of the display module along the first direction.

3. The display panel of claim 2, wherein the distance is in a range of 0.05 mm to 1.00 mm.

4. The display panel of claim 1, wherein the outer edge of the display panel and the step portion are coated with protective glue.

5. The display panel of claim 1, wherein the touch layer is disposed on a side away from the display module of the polarizing layer, and a side away from the polarizing layer of the touch layer is covered with a hard coating layer, wherein an outer edge of the hard coating layer is inwardly retracted, alone the first direction, from the outer edge of the touch layer.

6. The display panel of claim 1, wherein the touch layer is disposed on a side of the polarizing layer facing away from the display module, and the outer edge of the touch layer is inwardly retracted, along the first direction, from the outer edge of the polarizing layer.

7. The display panel of claim 1, wherein the other side of the support film is covered with a foam layer and the outer edge of the support film is inwardly retracted, along the first direction, from an outer edge of the foam layer.

8. The display panel of claim 1, wherein the display module comprises:
    a flexible substrate disposed on a side of the support film;
    a driver array layer disposed on a side away from the support film of the flexible substrate;
    a light emitting layer disposed on a side away from the flexible substrate of the driver array layer facing;
    a thin film encapsulating layer disposed on a side away from the driver layer of the light emitting layer.

9. The display panel of claim 1, wherein the outer edge of the display module outwardly extends a distance, along the first direction, from the outer edge of the support film; the outer edge of the polarizing layer and the outer edge of the touch layer outwardly extend a distance from the outer edge of the display module.

10. The display panel of claim 8, wherein the distance is in a range of 0.05 mm to 1.00 mm.

11. A display device, comprising:
    a display panel being bendable around a bending axis, extending along a first direction, to form a bendable portion further comprising:
    a support film;
    a display module disposed on a side of the support film, wherein the display module is disposed on an inner side of the bendable portion, wherein an outer edge of the display module is distant from an outer edge of the support film along the first direction to form a step portion between the outer edge of the display module and the outer edge of the support film; and
    a polarizing layer and a touch layer disposed on a side facing away from the support film of the display module, wherein an outer edge of the polarizing layer and an outer edge of the touch layer are distant from the outer edge of the display module along the first direction to form a step portion between the outer edge of the polarizing layer, the outer edge of the touch layer and the outer edge of the display module.

12. The display device of claim 11, wherein the outer edge of the display module is inwardly retracted a distance from the outer edge of the support film along the first direction, and the outer edge of the polarizing layer and the outer edge of the touch layer are inwardly retracted a distance from the outer edge of the display module along the first direction.

13. The display device of claim 12, wherein the distance is in a range of 0.05 mm to 1.00 mm.

14. The display device of claim 11, wherein the outer edge of the display module outwardly extends a distance, along the first direction, from the outer edge of the support film; the outer edge of the polarizing layer and the outer edge of the touch layer outwardly extend a distance from the outer edge of the display module.

15. The display device of claim 14, wherein the distance is in a range of 0.05 mm to 1.00 mm.

* * * * *